United States Patent
Tomizawa

(10) Patent No.: US 7,378,909 B2
(45) Date of Patent: May 27, 2008

(54) RADIO-FREQUENCY POWER AMPLIFIER APPARATUS AND METHOD OF ADJUSTING OUTPUT POWER THEREOF

(75) Inventor: Toshiharu Tomizawa, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 192 days.

(21) Appl. No.: 11/359,488

(22) Filed: Feb. 23, 2006

(65) Prior Publication Data

US 2006/0202756 A1 Sep. 14, 2006

(30) Foreign Application Priority Data

Feb. 23, 2005 (JP) .................. P. 2005-047692

(51) Int. Cl.
*H03G 3/30* (2006.01)
*H03G 5/16* (2006.01)

(52) U.S. Cl. .................. 330/285; 330/133; 330/310

(58) Field of Classification Search .............. 330/129, 330/133, 134, 285, 296, 297, 310
See application file for complete search history.

(56) References Cited

U.S. PATENT DOCUMENTS

| 6,701,134 | B1 * | 3/2004 | Epperson .................. 455/102 |
| 6,701,138 | B2 | 3/2004 | Epperson et al. |
| 7,123,094 | B2 * | 10/2006 | Tahara et al. .............. 330/285 |

FOREIGN PATENT DOCUMENTS

JP 2004-501527 A 1/2004

* cited by examiner

*Primary Examiner*—Khanh V Nguyen
(74) *Attorney, Agent, or Firm*—McDermott Will & Emery LLP

(57) ABSTRACT

By using a radio-frequency power amplifier which turns off an Nth stage radio-frequency amplifying transistor when the level of radio-frequency output power falls below a predetermined value, it is possible to improve the linearity when the level of the radio-frequency output power is so low.

10 Claims, 8 Drawing Sheets

RADIO-FREQUENCY POWER AMPLIFIER APPARATUS AND METHOD OF ADJUSTING OUTPUT POWER THEREOF

BACKGROUND OF THE INVENTION

1. Field of the Invention

The present invention relates to a radio-frequency power amplifier used in a mobile communication device or the like.

2. Description of the Related Art

A mobile phone system, such as EDGE (enhanced data GSM environment) or UMTS (universal mobile telecommunications system), has recently been the focus as the worldwide standard of next-generation mobile communications. In the mobile phone system, such as EDGE or UMTS, an output power control is required over a wide range and the high linearity is required in the characteristic of a modulation method adopted by the system. On the other hand, in recent years, since a mobile camera, game, a television tuner, and the like are mounted as application of a mobile phone, the power consumption of a mobile phone has significantly increased. Due to the above situation, it is strongly requested that a radio-frequency power amplifier, which comprises a radio-frequency transmission circuit, have high linearity and high efficiency at the same time.

In a mobile phone system according to the related art, the modulation control is performed in an orthogonal modulation method, and in order to realize the high linearity in the method, a radio-frequency power amplifier should operate as a class-A type amplifier. However, in the case of a class-A operation, the radio-frequency power amplifier continuously consumes a DC current, which does not improve the overall efficiency.

FIG. 8 illustrates a radio-frequency power amplifier, to which power is supplied from a power control regulator, disclosed in U.S. Pat. No. 6,701,138. Reference numeral 1 denotes a voltage control regulator block from which a voltage controlled by a control signal Vramp inputted through a control signal input terminal 10 is output. Reference numeral 2 denotes a radio-frequency power amplifier block formed by three-stage amplifying transistors including a first-stage amplifying transistor 6, a second-stage amplifying transistor 7, and a third-stage amplifying transistor 8. Predetermined fixed voltages are applied for a power source voltage Vcc1 of the first-stage amplifying transistor 6 and a bias voltage Vbias applied to a bias circuit 9 of the radio-frequency power amplifier block 2, respectively, and the same power source voltages output from the voltage control regulator block 1 are applied for a power source voltage Vcc2 of the second-stage amplifying transistor 7 and a power source voltage Vcc3 of the third-stage amplifying transistor 8. The relationship between the power source voltages Vcc2 and Vcc3 and the control signal Vramp has the following characteristic:

$$Vcc2 = Vcc3 = \alpha \times Vramp + \beta \quad \text{(Equation 1)}$$

Here, $\alpha$ is a gain in a voltage control regulator and $\beta$ is an offset amount.

The radio-frequency power amplifier is characterized in that both the high linearity and the high efficiency can be realized at the same time by making the third-stage amplifying transistor 8 always perform a switching operation, such as a class-E operation, for all levels of the output power.

In the radio-frequency power amplifier that performs the switching operation described above, the radio-frequency output power Pout of the radio-frequency power amplifier has the following characteristic:

$$Pout(W) = (2 \times Vcc - Vsat)^2/(8 \times Rload) \quad \text{(Equation 2)}$$

Here, it is defined that Vcc=Vcc2=Vcc3 and Rload is a load resistance of the radio-frequency power amplifier.

Furthermore, a radio-frequency output voltage Vout of the radio-frequency power amplifier is obtained from Equation 2 as follows:

$$Vout(V) = g \times (2 \times Vcc - Vsat) \quad \text{(Equation 3)}$$

Here, g is expressed as an integer.

In addition, from Equations 1 and 3, the relationship between the control signal Vramp and the radio-frequency output voltage Vout can be represented as follows:

$$\begin{aligned}Vout(V) &= 2 \times \alpha' \times Vramp + 2 \times \beta' + Vsat \\ &= G \times Vramp + Vramp\_offset\end{aligned} \quad \text{(Equation 4)}$$

Here, $\alpha'$, $\beta'$, G and Vramp_offset are expressed as an integer, respectively.

As can be seen from Equation 4, the radio-frequency output voltage Vout is proportional to the control signal Vramp.

Further, the radio-frequency power amplifier can be used in an EER (Envelope Elimination and Restoration) technique, which is a polar modulation technique disclosed in JP-T-2004-501527. Since details of the EER technique is disclosed in JP-T-2004-501527, the EER technique will be briefly described. In the EER technique, a modulation signal in, for example, a mobile phone is divided into an amplitude component and a phase component, and the phase component is input as a radio-frequency signal to a radio-frequency input terminal 11 of the radio-frequency power amplifier and the amplitude component is input to a power source voltage terminal. Thereby, a signal in which the amplitude component and the phase component are mixed is output to a radio-frequency output terminal 12 of the radio-frequency power amplifier. The reason is that, because the radio-frequency power amplifier performs a switching operation such as a class-E operation, the relevance of the amplitude component is very low but the relevance of the phase component is very high between the radio-frequency input terminal 11 of the radio-frequency power amplifier and the radio-frequency output terminal 12 of the radio-frequency power amplifier, and the relevance of the amplitude component is very high between the power source voltage terminal of the radio-frequency power amplifier and the radio-frequency output terminal 12 of the radio-frequency power amplifier.

As such, in the modulation control of a radio-frequency transmission circuit of a mobile phone or the like, the high linearity and the high efficiency are realized by the EER technique.

However, in the EER technique, since the amplitude component of the modulation signal is input from the control signal Vramp to be reproduced to the radio-frequency output voltage Vout of the radio-frequency power amplifier, the control signal Vramp and the radio-frequency output voltage Vout should be proportional to each other and it is required not to have an offset. If the two conditions are not satisfied, the precision of modulation is significantly lowered, which causes the communication quality to be deteriorated.

However, the linearity of the radio-frequency power amplifier shown in FIG. 8 cannot be maintained in a region where the radio-frequency output voltage Vout is low as shown in FIG. 9. In the non-linear region, the control signal Vramp and the radio-frequency output voltage Vout are not proportional to each other. Further, in the relationship between the control signal Vramp and the radio-frequency output voltage Vout, as expressed in Equation 4, the radio-frequency output voltage Vout has only an offset amount Vramp_offset with respect to the control signal Vramp. The non-linearity in a region, where the radio-frequency output voltage Vout is so low, or the offset component Vramp_offset with respect to the control signal Vramp causes the precision of modulation in the EER technique to be significantly lowered, which deteriorates the communication quality.

SUMMARY OF THE INVENTION

In order to solve the above-mentioned problems, it is an advantage of the invention to provide a radio-frequency power amplifier capable of improving the linearity in a region where the output voltage is low.

Further, it is another advantage of the invention to provide an adjusting method of canceling an offset component Vramp_offset with respect to the control signal Vramp.

According to an aspect of the invention, a radio-frequency power amplifier apparatus comprising N amplifiers sequentially connected in series, an input signal being input to a first amplifier, and an output signal being output from an Nth amplifier, an (N−1)th power source voltage control regulator which supplies an (N−1)th adjustable power source voltage to an (N−1)th amplifier in accordance with an (N−1)th control signal, and an Nth power source voltage control regulator which supplies an Nth adjustable power source voltage to the Nth amplifier in accordance with an Nth control signal, wherein, when the output signal is equal to or higher than a predetermined value, the Nth control signal is identical to the (N−1)th control signal, and wherein, when the output signal is lower than the predetermined value, the Nth control signal is fixed to set the Nth power source voltage at a fixed voltage.

That is, according to the invention, a radio-frequency power amplifier having an Nth stage configuration includes N amplifiers sequentially connected in series. An amplifier to which an input signal is input is a first amplification stage and an output signal is output from an Nth amplification stage. A power source voltage Vcc(N−1) at an (N−1)th amplification stage is supplied through a power source voltage control regulator Reg(N−1) having a function of varying the power source voltage Vcc(N−1) according to a control signal Vramp(N−1), a power source voltage VccN at the Nth amplification stage is supplied through a power source voltage control regulator RegN having a function of varying the power source voltage VccN according to a control signal VrampN, and the power source voltage VccN supplied to an amplifier at the Nth amplification stage is set to become a fixed voltage when the output signal falls below the predetermined value.

In the radio-frequency power amplifier according to the invention, preferably, a fixed voltage is supplied to a power source voltage Vcc1 at the first amplification stage.

Furthermore, in the radio-frequency power amplifier according to the invention, preferably, when the signal levels of the control signal Vramp(N−1) and the control signal VrampN are lower than the predetermined value, the control signal VrampN has a fixed voltage value lower than the level of the control signal Vramp(N−1).

Furthermore, in the radio-frequency power amplifier according to the invention, preferably, hysteresis characteristics are provided by setting a threshold value 1 and a threshold value 2 different from each other when the control signal Vramp(N−1) and the control signal VrampN are switching-controlled at a predetermined signal level, the threshold value 1 being used to switch from a signal level lower than the predetermined signal level to a signal level higher than the predetermined signal level and the threshold value 2 being used to switch from the signal level higher than the predetermined signal level to the signal level lower than the predetermined signal level.

Furthermore, in the radio-frequency power amplifier according to the invention, preferably, each of the amplification stages includes a transistor amplification element.

Furthermore, in the radio-frequency power amplifier according to the invention, preferably, the power source voltage control regulator includes an error amplifier and a feedback circuit loop, the error amplifier having a first input terminal to which the control signal is input and a second input terminal connected to a voltage regulator from which an output voltage is supplied and the feedback circuit loop coupling between an output terminal of the voltage regulator and the second input terminal of the error amplifier.

According to another aspect of the invention, there is provided a method of adjusting output power such that a control signal VrampN has a fixed potential when an output signal of an amplifier at an Nth stage falls below a predetermined value, by using the radio-frequency power amplifier described above.

Still further, according to another aspect of the invention, there is provided a method of adjusting output power comprising providing N amplifiers sequentially connected in series, an input signal being input to a first amplifier, and an output signal being output from an Nth amplifier, supplying an (N−1)th adjustable power source voltage to an (N−1)th amplifier in accordance with an (N−1)th control signal, and supplying an Nth adjustable power source voltage to the Nth amplifier in accordance with an Nth control signal, wherein, when the output signal is equal to or higher than a predetermined value, the Nth control signal is identical to the (N−1)th control signal, and wherein, when the output signal is lower than the predetermined value, the Nth control signal is fixed to set the Nth adjustable power source voltage at a fixed voltage.

A modulation signal and power control information in a mobile phone are processed in a baseband unit and a control system unit and divided an amplitude component and a phase component to be output. The phase component is converted into a radio-frequency signal by an up-converter to be input to a radio-frequency input terminal of the radio-frequency power amplifier. The amplitude component is input to a control signal input terminal of the voltage control regulator, and the power source voltage of the radio-frequency power amplifier is supplied as a voltage according to a control signal. By using the EER technique, the amplitude component and the phase component of a modulated wave can be mixed at the radio-frequency output terminal of the radio-frequency power amplifier, and thus a modulated signal can be reproduced.

The radio-frequency power amplifier to which power is supplied from a power control regulator according to the invention includes a voltage control regulator block, which is composed of two-stage voltage control regulators or more, and N-stage amplifying transistors, N being 3 or more. A fixed voltage is supplied for the power source voltage Vcc1 of a first-stage amplifying transistor, and a proper fixed voltage is supplied for the bias voltage Vbias of the radio-frequency power amplifier. On the other hand, the output voltage of the voltage regulator RegN controlled by the control signal VrampN is supplied to the power source voltage VccN of the Nth stage amplifying transistor. In the same manner, the output voltage of the voltage regulator Reg(N−1) controlled by the control signal Vramp(N−1) is supplied to the power source voltage Vcc(N−1) of the (N−1)-stage amplifying transistor.

Here, for the control signal VrampN, when a control signal common to the control signal Vramp(N−1) is input, the Nth stage amplifying transistor performs a switching operation, and thus Equation 4 is obtained. Accordingly, the radio-frequency output voltage Vout of the radio-frequency power amplifier is proportional to the control signal VrampN. However, it is not possible to maintain the linearity in a region where an output voltage is so low in the same manner as in the technique according to the related art.

Therefore, in the circuit configuration and the control method of the invention, by using the power source voltage VccN of the Nth stage amplifying transistor, the control signal VrampN of the voltage control regulator RegN is adjusted in a region, where the radio-frequency output voltage Vout is so low, so as to turn off the Nth stage amplifying transistor. In this case, the (N−1)th stage amplifying transistor performs a switching operation, and thus the radio-frequency output voltage of the (N−1)th stage amplifying transistor can be expressed by Equation 4. Accordingly, the radio-frequency output voltage of the (N−1)th stage amplifying transistor is proportional to the control signal Vramp(N−1). In addition, since the Nth stage amplifying transistor is turned off, the Nth stage amplifying transistor serves as an attenuator in a region where a radio-frequency output voltage is so low, which improves the linearity.

As described above, the control signal VrampN is characterized to perform two controls according to the radio-frequency output voltage Vout.

A threshold value for switching between the two controls can be set beforehand on the basis of the specifications of a power control or a modulation method adopted in each application, and the threshold value is stored in the system control unit. Based on the threshold value, the system control unit switches a control method by comparing power setting level information, which is requested from a network to terminal equipment, such as a mobile phone, with power setting level information on which the terminal equipment is determined.

Here, a control method in which a requested output voltage is higher than a threshold value and control signals Vramp(N−1) and VrampN are commonly controlled is defined as 'normal control', and a control method in which the requested output voltage is lower than the threshold value and an Nth stage amplifying transistor is set to be turned off is defined as 'low output voltage control'.

The circuit configuration and the control method according to the invention is characterized in that the power source voltage VccN of the Nth stage amplifying transistor adjusts the control signal VrampN of the voltage control regulator RegN in a region, where the radio-frequency output voltage Vout is so low, so as to turn off the Nth stage amplifying transistor. Accordingly, the Nth stage amplifying transistor serves as an attenuator in a region where a radio-frequency output voltage is so low, which improves the linearity.

As described above, the control signal VrampN is characterized to perform two controls according to the radio-frequency output voltage Vout.

BRIEF DESCRIPTION OF THE DRAWINGS

FIG. 1 is a block diagram illustrating parts related to a transmission part and a receiving part in a mobile communication device or the like;

DETAILED DESCRIPTION OF THE PREFERRED EMBODIMENTS

Hereinafter, a radio-frequency power amplifier according to embodiments of the invention will be described.

First Embodiment

Hereinafter, a radio-frequency power amplifier according to a first embodiment of the invention will be described with reference to the drawings.

Figure 1:
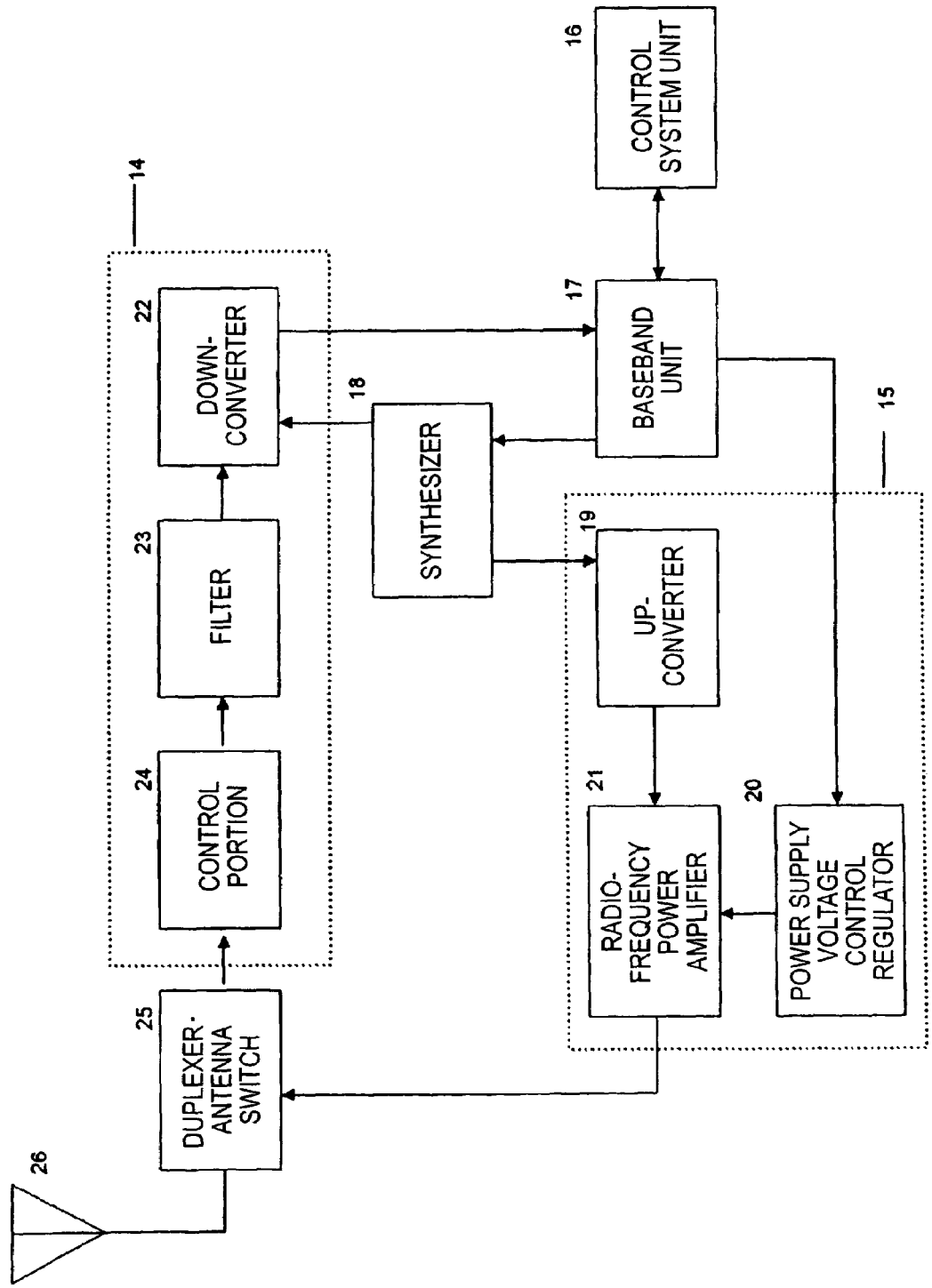
Figure 2:
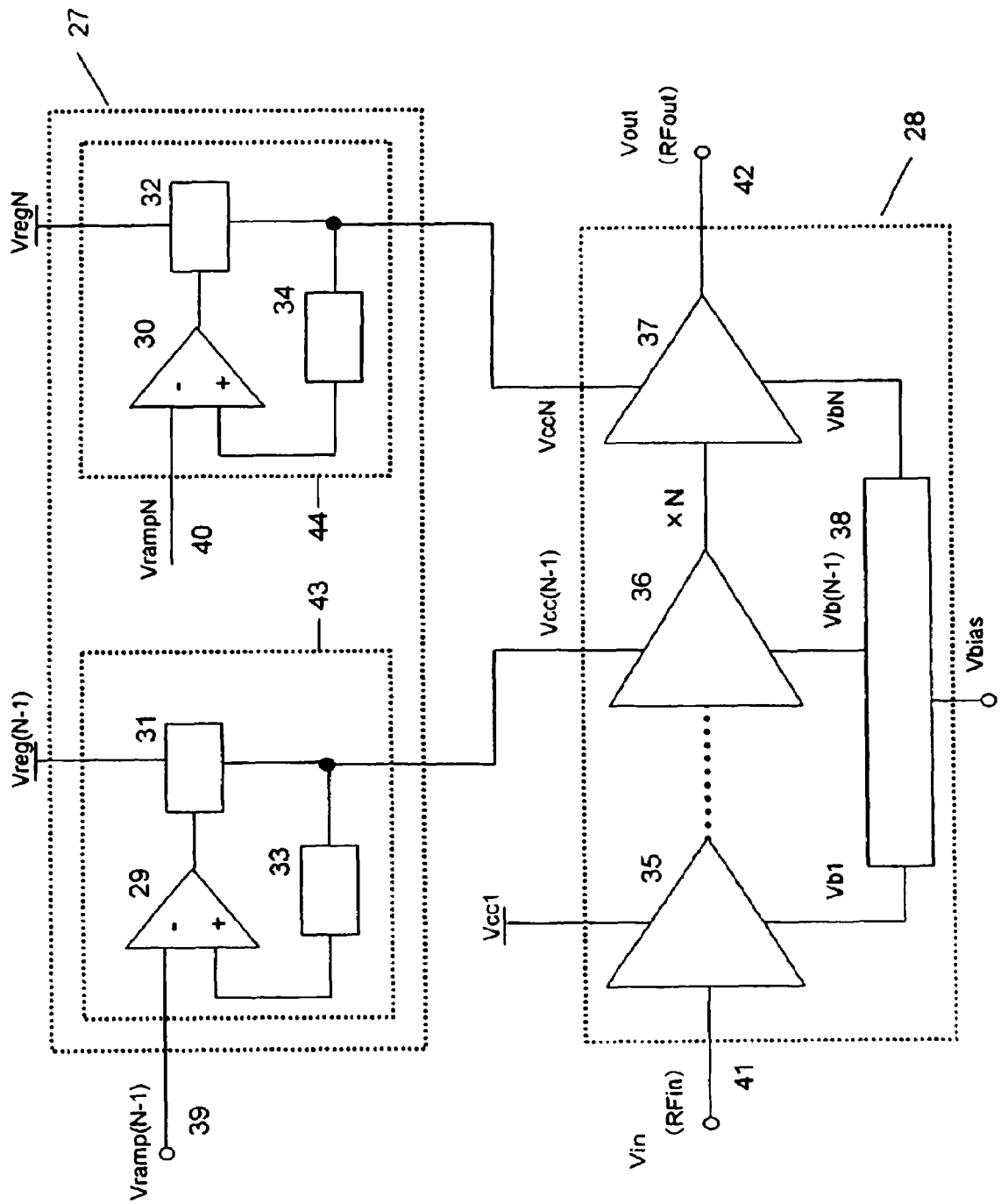
FIG. 2 is a view illustrating the configuration of a radio-frequency power amplifier to which power is supplied from a voltage control regulator according to the invention.
Figure 3:
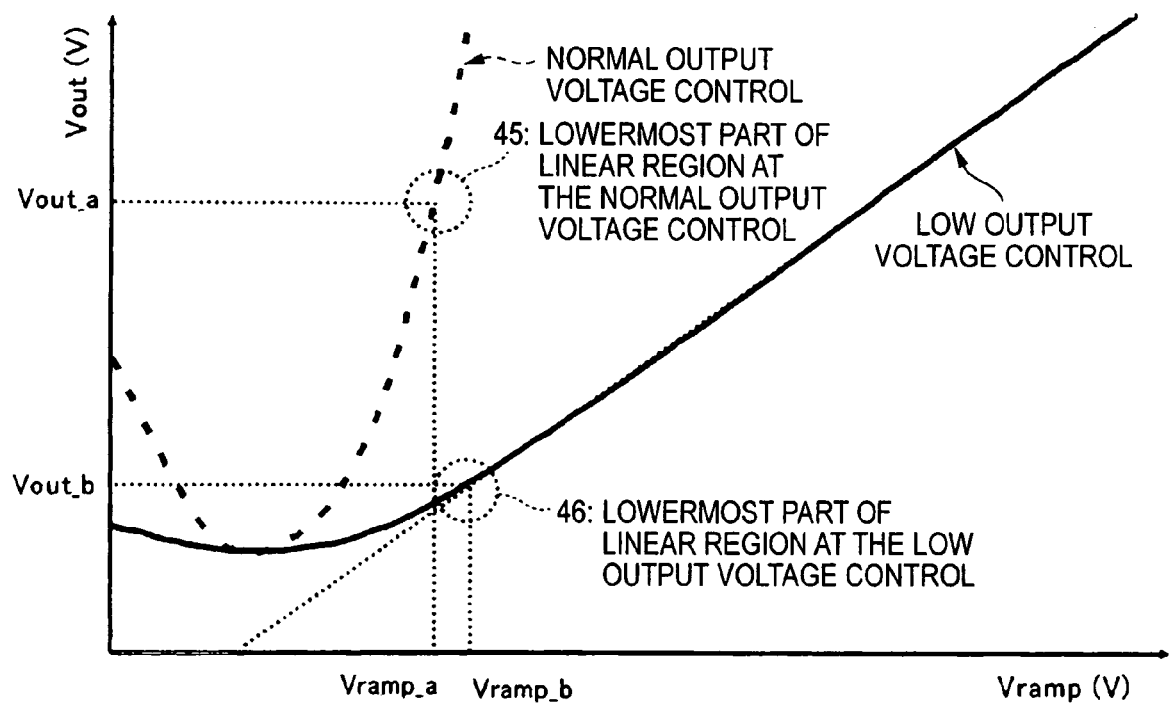
FIG. 3 is a view comparing the linearity due to the difference between a normal output voltage control and a low output voltage control.

FIG. 1 is a block diagram illustrating parts related to a transmission part and a receiving part in a mobile communication device or the like, FIG. 2 is a view illustrating the configuration of a transmission circuit block, and FIG. 3 is a view comparing the linearity due to the difference between a normal output voltage control and a low output voltage control.

A so-called N stage radio-frequency power amplifier, having a first amplification stage through which an input signal is inputted and an Nth amplification stage through which an output signal is output, is characterized in that a power source voltage Vcc(N−1) at an (N−1)th amplification stage is supplied through a power source voltage control regulator Reg(N−1) which has a function of varying the power source voltage Vcc(N−1) according to a control signal Vramp(N−1) supplied from the outside, a power source voltage VccN at the Nth amplification stage is supplied through a power source voltage control regulator RegN which has a function of varying the power source voltage VccN according to a control signal VrampN, and the power source voltage VccN becomes a fixed voltage when the output signal falls below a predetermined value.

FIG. 2 illustrates a voltage control regulator block 27 and a radio-frequency power amplifier block 28 having N-stage amplifying transistors. The power supply voltage control regulator block 27 and the radio-frequency power amplifier block 28 correspond to the power supply voltage control regulator 20 and the radio-frequency power amplifier 21 shown in FIG. 1, respectively. Here, construction of a radio-frequency power amplifier having three-stage bipolar transistors will be described by way of an example (hereinafter, N=3).

First, proper fixed voltages are applied for power sources Vreg2 and Vreg3 of power supply voltage control regulators 43 and 44 at respective stages and for a bias voltage Vbias of the radio-frequency power amplifier block 28. The power source voltage of a second-stage amplifying transistor 36 is supplied from a power supply voltage control regulator Reg2(43) controlled by a control signal Vramp2 inputted to a control signal input terminal 39, and in the same manner, the power source voltage of a third-stage amplifying transistor 37 is supplied from a power supply voltage control regulator Reg3(44) controlled by a control signal Vramp3 inputted to a control signal input terminal 40.

An amplitude signal of a modulated wave or power control information thereof is operated in a baseband unit 17 and a control system unit 16 and is input as control signals Vramp2 and Vramp3 of the power supply voltage control regulators 43 and 44. The power source voltage of a second-stage error amplifier 29 is supplied from a voltage regulator 31 controlled by the control voltage Vramp2, and in the same manner, the power source voltage of a third-stage operational amplifier 30 is supplied from a voltage regulator 32 controlled by the control voltage Vramp3. At respective stages, feedback circuit loops 33, 34 are coupled between output terminals of the voltage regulators 31, 32 and input terminals of the error amplifiers 29, 30, respectively.

In the normal output voltage control, the two control signals Vramp2 and Vramp3 are supplied from the baseband unit 17 to be input to control signal input terminals of the voltage regulators 31 and 32, respectively. In the normal output voltage control, since the same control signals are supplied for the control signals Vramp2 and Vramp3, the relationship Vramp=Vramp2=Vramp3 is obtained. A voltage output from the second-stage power supply voltage control regulator Reg2(43) is supplied to the second-stage amplifying transistor 36, and in the same manner, a voltage output from the third-stage power supply voltage control regulator Reg3(44) is supplied to the third-stage amplifying transistor 37. In this case, since the third-stage amplifying transistor 37 performs a switching operation, the relationship between the radio-frequency voltage output Vout, appearing at a radio-frequency output terminal 42 of the radio-frequency power amplifier block, and the control signal Vramp is represented by Vout (V)=$G_1 \times$Vramp3+Vramp_offset, in the same manner as Equation 4.

As such, in the radio-frequency output terminal 42 of the radio-frequency power amplifier block, the radio-frequency output voltage Vout is proportional to the control signal Vramp.

On the other hand, in the case of a low output voltage control, a power source voltage Vcc3 of the third-stage amplifying transistor 37 is set such that the third-stage amplifying transistor 37 is turned off by adjusting the control signal Vramp3 of the power supply voltage control regulator Reg3(44). In this case, since the second-stage amplifying transistor 36 performs a switching operation, the radio-frequency output voltage Vout appearing at the second-stage amplifying transistor 36 is represented by the following equation:

$$V\text{out} = G_2 \times V\text{ramp2} + V\text{ramp\_offset2} \quad \text{(Equation 5)}$$

Furthermore, since the third-stage amplifying transistor 37 is turned off, the third-stage amplifying transistor 37 serves as an attenuator in a region where a radio-frequency output voltage is so low. Accordingly, the radio-frequency output voltage of the third-stage amplifying transistor 37 is also proportional to the control signal Vramp2, and as a result, the linearity can be improved.

FIG. 3 illustrates a result obtained by comparing characteristics of the normal output voltage control and the low output voltage control. By comparing a lowermost part 45 of a linear region in the normal output voltage control and a lowermost part 46 of a linear region in the low output voltage control, it can be definitely seen that the linearity has improved in a region where the radio-frequency output voltage is low.

By setting a threshold value for switching between the two controls in a system control unit beforehand, the two controls can be switched according to the level of the radio-frequency output voltage.

In the embodiment, even though the invention has been described by using a typical bipolar transistor, a field effect transistor may be applied so as to have the same effect.

Second Embodiment

Figure 4:
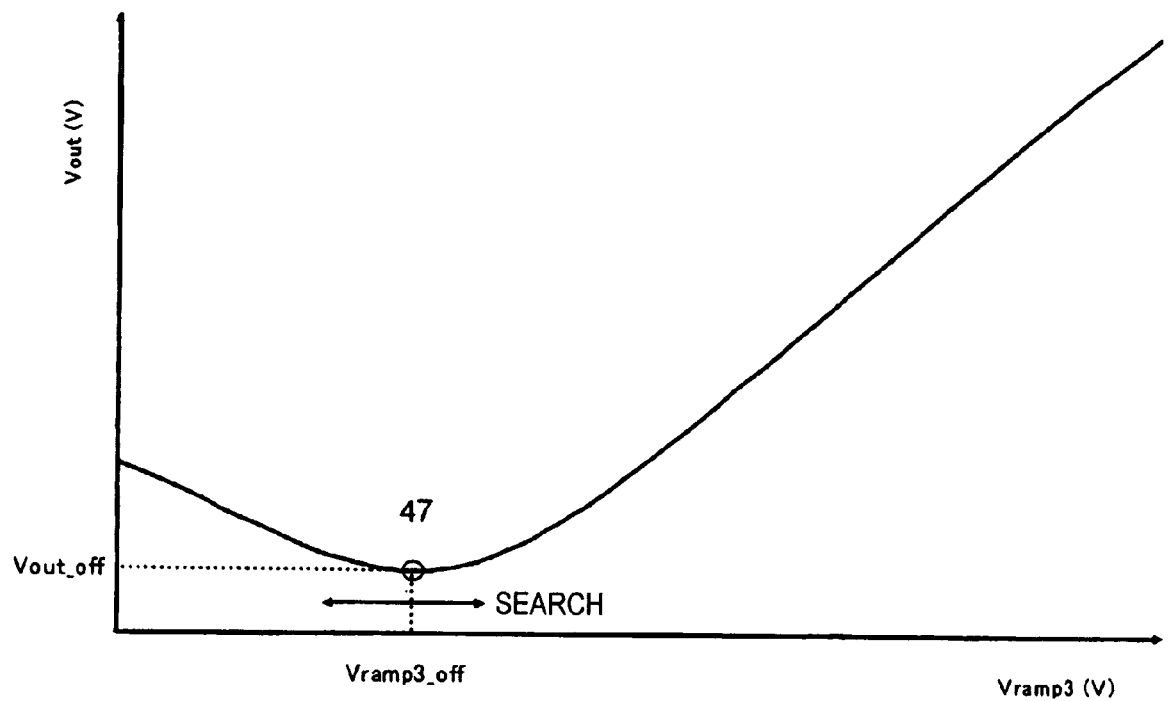
FIG. 4 is a view illustrating a method of adjusting a control signal Vramp3 in a low output voltage control.

FIG. 4 illustrates a second embodiment of the invention.

In the radio-frequency power amplifier to which power is supplied from the voltage control regulator described in the first embodiment, it is necessary to adjust the set value of the control signal Vramp3 to an optimal value so as to turn off the third-stage amplifying transistor 37 in the low output voltage control.

In order to adjust the set value of the control signal Vramp3, a fixed voltage for the control signal Vramp2 is applied from the baseband unit 17 and is input as a control signal of the power supply voltage control regulator Reg2 (43). In this state, a point 47 at which the radio-frequency output voltage Vout becomes a minimum value is searched by varying the voltage value of the control signal Vramp3. Then, the voltage value of the control signal Vramp3 when the radio-frequency output voltage Vout becomes a minimum value is obtained. At this time, assuming that the set value of the control signal Vramp3 is Vramp3_off, the value Vramp3_off is set by the control system 16 and used as the set value of the control signal Vramp3 in the low output voltage control. As a result, it is possible to reliably turn off the third-stage amplifying transistor 37.

Third Embodiment

Figure 5:
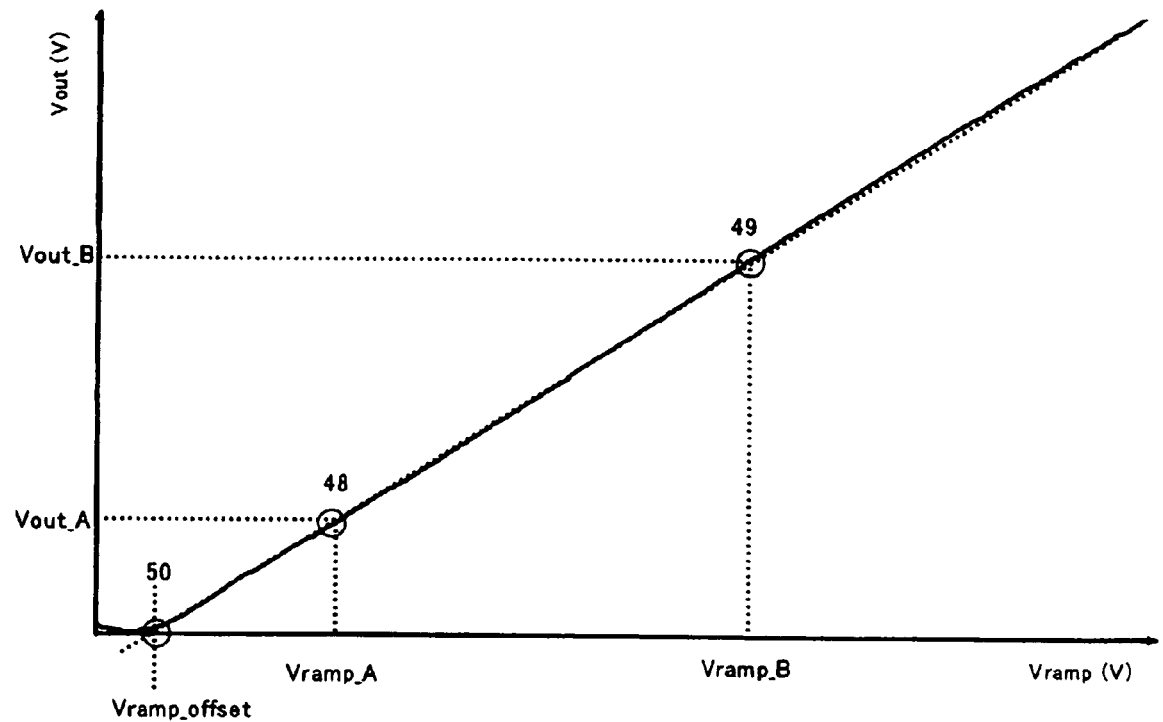
FIG. 5 is a view illustrating an adjusting method of canceling an offset at a Vramp axis.

FIG. 5 illustrates a third embodiment of the invention.

In the configuration of the radio-frequency power amplifier to which power is supplied from the power supply voltage control regulator Reg2(43) described in the first embodiment, when the radio-frequency power amplifier, for example, in the normal output voltage control is explained, the radio-frequency output voltage Vout with respect to the control signal Vramp is expressed as Equation 4. That is, the radio-frequency output voltage Vout is proportional to the control signal Vramp but has an offset only amount Vramp_offset with respect to the control signal Vramp. The offset component causes the precision of modulation to be lowered in a modulation signal obtained by using the EER technique, which deteriorates the communication quality.

Hereinafter, an adjusting method of canceling an offset will be described with reference to FIG. 5. Here, it is necessary to set two points beforehand, which are separated from each other, in a region where the radio-frequency output voltage Vout with respect to the control signal Vramp is linear, and the set voltage value is stored in the control system unit 16.

Next, in the adjusting process, the stored control signal Vramp is set by the control system unit 16 and the baseband unit 17 shown in FIG. 1 and the radio-frequency output voltages Vout at the two points 48 and 49 are measured. Based on the measured radio-frequency output voltages Vout, the control system unit 16 performs an operation of obtaining a straight line passing through the two points.

Then, a voltage value of the control signal Vramp when the characteristic of the straight line passes through a point satisfying Vout=0 V is obtained by an operation. The value of the control signal Vramp at this time becomes the offset amount Vramp_offset.

In order to cancel the offset, the offset amount Vramp_offset is subtracted from the control signal Vramp, and thus the adjusting process can be performed. Accordingly, assuming that a control signal after the adjusting process has been performed is Vramp', Vramp' can be represented as follows:

$$Vramp' = Vramp - Vramp\_offset \quad \text{(Equation 6)}$$

In addition, by using Equations 4 and 6, an output voltage Vout' after the adjusting process has been performed is obtained as follows:

$$Vout' = Vramp' + Vramp\_offset = Vramp \quad \text{(Equation 7)}$$

As a result, the control signal Vramp which does not have an offset component reappears as the output voltage Vout' after the adjusting process has been performed.

The adjusting process can also be performed in the low output voltage control as well as the normal output voltage control.

Fourth Embodiment

Figure 6:
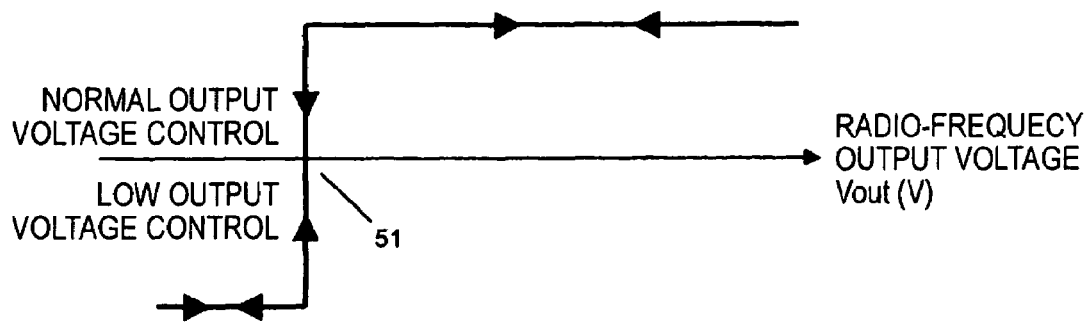
FIG. 6 is a view in which a control method is switched by setting a threshold value.
Figure 7:
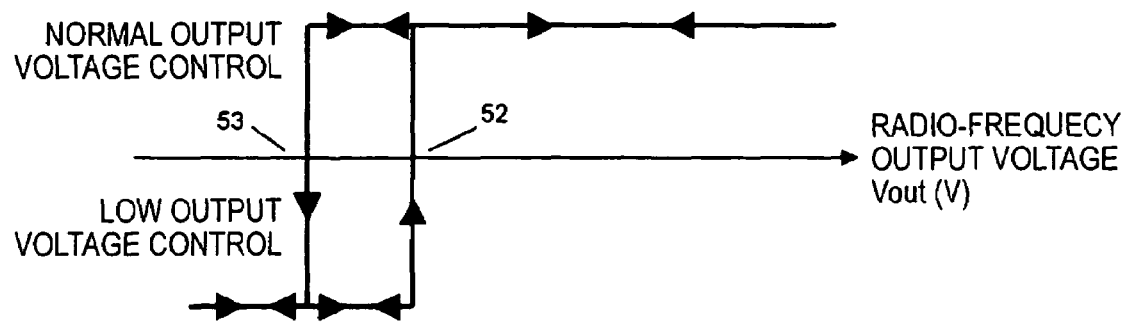
FIG. 7 is a view in which a control method is switched by setting threshold values having hysteresis characteristics.
Figure 8:
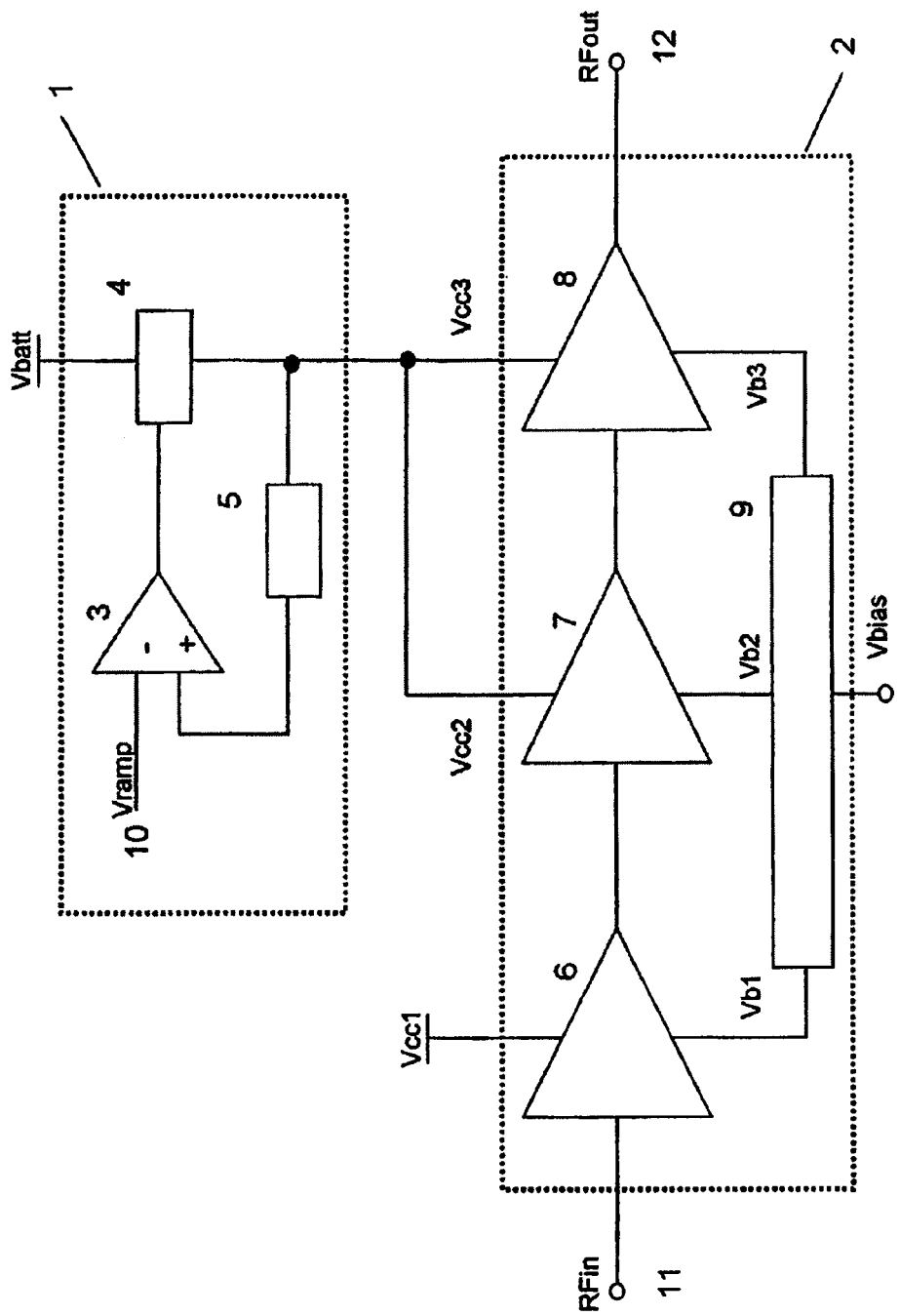
FIG. 8 is a view illustrating the configuration of a radio-frequency power amplifier to which power is supplied from a power supply voltage control regulator according to the related art.
Figure 9:
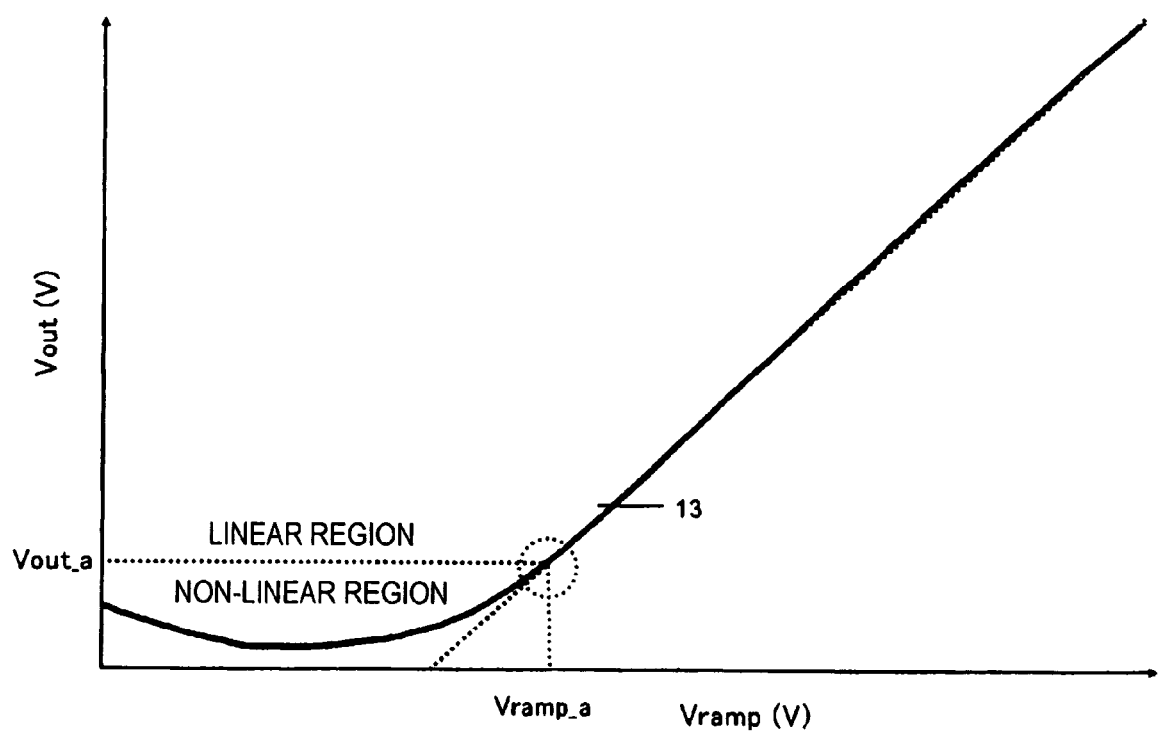
FIG. 9 is a view illustrating the characteristic of a radio-frequency output voltage with respect to a control signal Vramp in a circuit configuration according to the related art.

An adjusting method according to a fourth embodiment of the invention is illustrated with reference to FIGS. 6 and 7.

In the power supply voltage control regulator and the radio-frequency power amplifier described in the first embodiment, the threshold value for switching between the low output voltage control and the normal output voltage control can be set beforehand on the basis of specifications of a power control or a modulation method adopted in each application. For example, as shown in FIG. 6, the low output voltage control and the normal output voltage control can be properly switched before and after a threshold value 51. However, depending on the application used, there is a case in which frequent switching operations should be avoided. In this case, as shown in FIG. 7, a threshold value 2 (53), at which the normal output voltage control switches to the low output voltage control, and a threshold value 1 (52), at which the low output voltage control switches to the normal output voltage control, are set so as to have a gap therebetween, thereby realizing hysteresis control. As a result, it is possible to perform a proper control.

As described above, the invention is effective for a wireless device, such as a mobile phone, adopting a high-density modulation system, such as the EDGE or the UMTS.

This application is based upon and claims the benefit of priority of Japanese Patent Application No. 2005-047692 filed on Feb. 23, 2005, the contents of which are incorporated herein by reference in its entirety.

What is claimed is:

1. A radio-frequency power amplifier apparatus comprising:

N amplifiers sequentially connected in series, an input signal being input to a first amplifier, and an output signal being output from an Nth amplifier;

an (N−1)th power source voltage control regulator which supplies an (N−1)th adjustable power source voltage to an (N−1)th amplifier in accordance with an (N−1)th control signal; and an Nth power source voltage control regulator which supplies an Nth adjustable power source voltage to the Nth amplifier in accordance with an Nth control signal, wherein, when the output signal is equal to or higher than a predetermined value that is larger than a value in which a linearity between the output signal and the Nth control signal can not be maintained, the Nth control signal is identical to the (N−1)th control signal, wherein, when the output signal is lower than the predetermined value, the Nth control signal is fixed to set the Nth adjustable power source voltage at a fixed voltage, and wherein a first power source voltage of the first amplifier is fixed.

2. The radio-frequency power amplifier apparatus according to claim 1, wherein, when the signal levels of the (N−1)th control signal and the Nth control signal are lower than the predetermined value, the Nth control signal has a fixed voltage value lower than the level of the (N−1)th control signal.

3. The radio-frequency power amplifier apparatus according to claim 1, wherein hysteresis characteristics are provided by setting a first threshold value and a second threshold value different from each other when the (N−1)th control signal and the Nth control signal are switching-controlled at a predetermined signal level, the first threshold value being used to switch from a signal level lower than the predetermined signal level to a signal level higher than the predetermined signal level and the second threshold value being used to switch from the signal level higher than the predetermined signal level to the signal level lower than the predetermined signal level.

4. The radio-frequency power amplifier apparatus according to claim 1, wherein each of the amplifier comprises a transistor amplification element.

5. The radio-frequency power amplifier apparatus according to claim 1, wherein the power source voltage control regulator includes an error amplifier and a feedback circuit loop, the error amplifier having a first input terminal to which the control signal is input and a second input terminal connected to a voltage regulator from which an output voltage is supplied and the feedback circuit loop coupling between an output terminal of the voltage regulator and the second input terminal of the error amplifier.

6. The radio-frequency power amplifier apparatus according to claim 1, further comprising a baseband unit which supplies the (N−1)th control signal and the Nth control signal to the (N−1)th power source voltage control regulator and the Nth power source voltage control regulator, respectively.

7. A method of adjusting output power comprising:

providing N amplifiers sequentially connected in series, an input signal being input to a first amplifier, and an output signal being output from an Nth amplifier;

supplying an (N−1)th adjustable power source voltage to an (N−1)th amplifier in accordance with an (N−1)th control signal; and supplying an Nth adjustable power source voltage to the Nth amplifier in accordance with an Nth control signal, wherein, when the output signal is equal to or higher than a predetermined value that is larger than a value in which a linearity between the output signal and the Nth control signal can not be maintained, the Nth control signal is identical to the (N−1)th control signal, wherein, when the output signal is lower than the predetermined value, the Nth control signal is fixed to set the Nth adjustable power source voltage at a fixed voltage, and wherein a first power source voltage of the first amplifier is fixed.

8. The method of adjusting output power according to claim 7, wherein, when the signal levels of the (N−1)th control signal and the Nth control signal are lower than the predetermined value, the Nth control signal has a fixed voltage value lower than the level of the (N−1)th control signal.

9. The method of adjusting output power according to claim 7, wherein hysteresis characteristics are provided by setting a first threshold value and a second threshold value different from each other when the (N−1)th control signal and the Nth control signal are switching-controlled at a predetermined signal level, the first threshold value being used to switch from a signal level lower than the predetermined signal level to a signal level higher than the predetermined signal level and the second threshold value being used to switch from the signal level higher than the predetermined signal level to the signal level lower than the predetermined signal level.

10. The method of adjusting output power according to claim 7, wherein each of the amplifier comprises a transistor amplification element.

* * * * *